United States Patent
Gill

(10) Patent No.: US 7,626,787 B2
(45) Date of Patent: Dec. 1, 2009

(54) METHOD AND APPARATUS FOR USING A SPECULAR SCATTERING LAYER IN A FREE LAYER OF A MAGNETIC SENSOR WHILE STABILIZING THE FREE LAYER BY DIRECT COUPLING WITH AN ANTIFERROMAGNETIC LAYER

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 523 days.

(21) Appl. No.: 11/370,903

(22) Filed: Mar. 8, 2006

(65) Prior Publication Data

US 2007/0211393 A1    Sep. 13, 2007

(51) Int. Cl.
*G11B 5/39* (2006.01)
*G11B 5/127* (2006.01)

(52) U.S. Cl. ............................................... 360/324.12
(58) Field of Classification Search ....... 360/324–324.2
See application file for complete search history.

(56) References Cited

U.S. PATENT DOCUMENTS

| | | | | |
|---|---|---|---|---|
| 6,407,890 B1 * | 6/2002 | Gill | | 360/314 |
| 6,636,389 B2 * | 10/2003 | Gill | | 360/314 |
| 6,700,753 B2 | 3/2004 | Singleton et al. | | |
| 6,795,279 B2 * | 9/2004 | Singleton et al. | | 360/324.11 |
| 6,831,816 B2 * | 12/2004 | Gill | | 360/324.12 |
| 6,989,973 B2 * | 1/2006 | Horng et al. | | 360/324.1 |
| 7,177,122 B2 * | 2/2007 | Hou et al. | | 360/324.12 |
| 7,443,638 B2 * | 10/2008 | Wang et al. | | 360/324.12 |
| 2002/0034661 A1 * | 3/2002 | Gillies et al. | | 428/692 |
| 2002/0048127 A1 * | 4/2002 | Fukuzawa et al. | | 360/324.1 |
| 2002/0081458 A1 | 6/2002 | Hasegawa et al. | | |
| 2003/0129454 A1 * | 7/2003 | Suzuki | | 428/694 EC |
| 2004/0141258 A1 | 7/2004 | Singleton et al. | | |
| 2005/0052793 A1 | 3/2005 | Hong et al. | | |
| 2005/0052795 A1 | 3/2005 | Yoshikawa et al. | | |
| 2005/0057863 A1 | 3/2005 | Horng et al. | | |
| 2006/0187591 A1 * | 8/2006 | Gill et al. | | 360/324.12 |

OTHER PUBLICATIONS

Mao et al., "Spin-Valve Heads With Self-Stabilized Free Layer by Antiferromagnet," Jan. 2002, IEEE Transactions on Magnetics, vol. 38, No. 1, pp. 26-31.*

* cited by examiner

*Primary Examiner*—William J Klimowicz
(74) *Attorney, Agent, or Firm*—Merchant & Gould

(57) ABSTRACT

A method and apparatus for using a specular scattering layer in a free layer of a magnetic sensor while stabilizing the free layer by direct coupling with an antiferromagnetic layer is disclosed. A specular scattering layer is formed in a free layer of a magnetic sensor while stabilizing the free layer by direct coupling with an antiferromagnetic layer. An antiferromagnetic layer is formed abutting the free layer to provide direct exchange coupling with the free layer. The specular layer in the free layer removes any ΔR degradation caused by placement of an antiferromagnetic layer over the free layer.

24 Claims, 7 Drawing Sheets

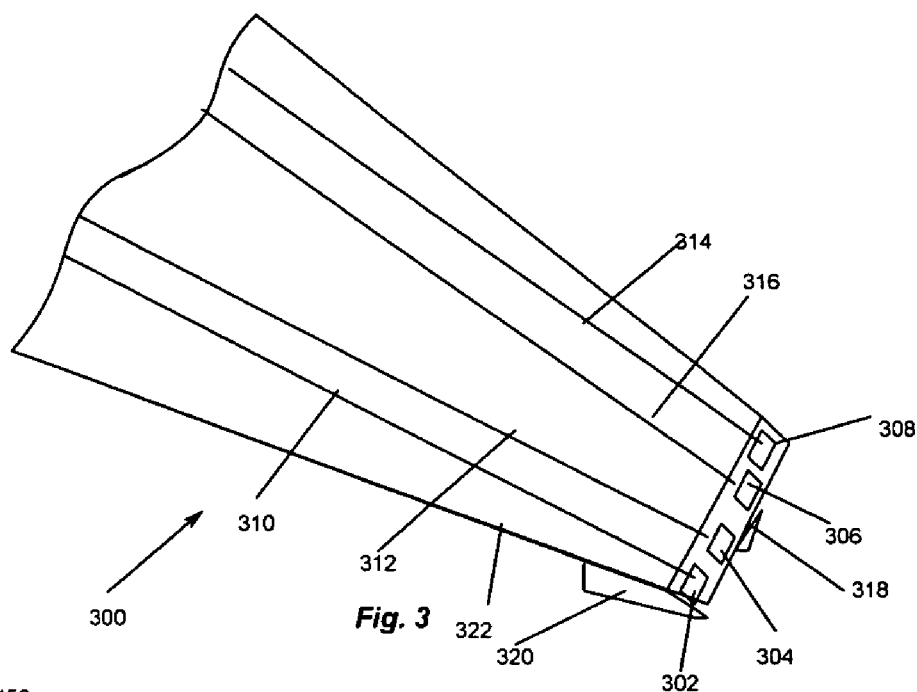
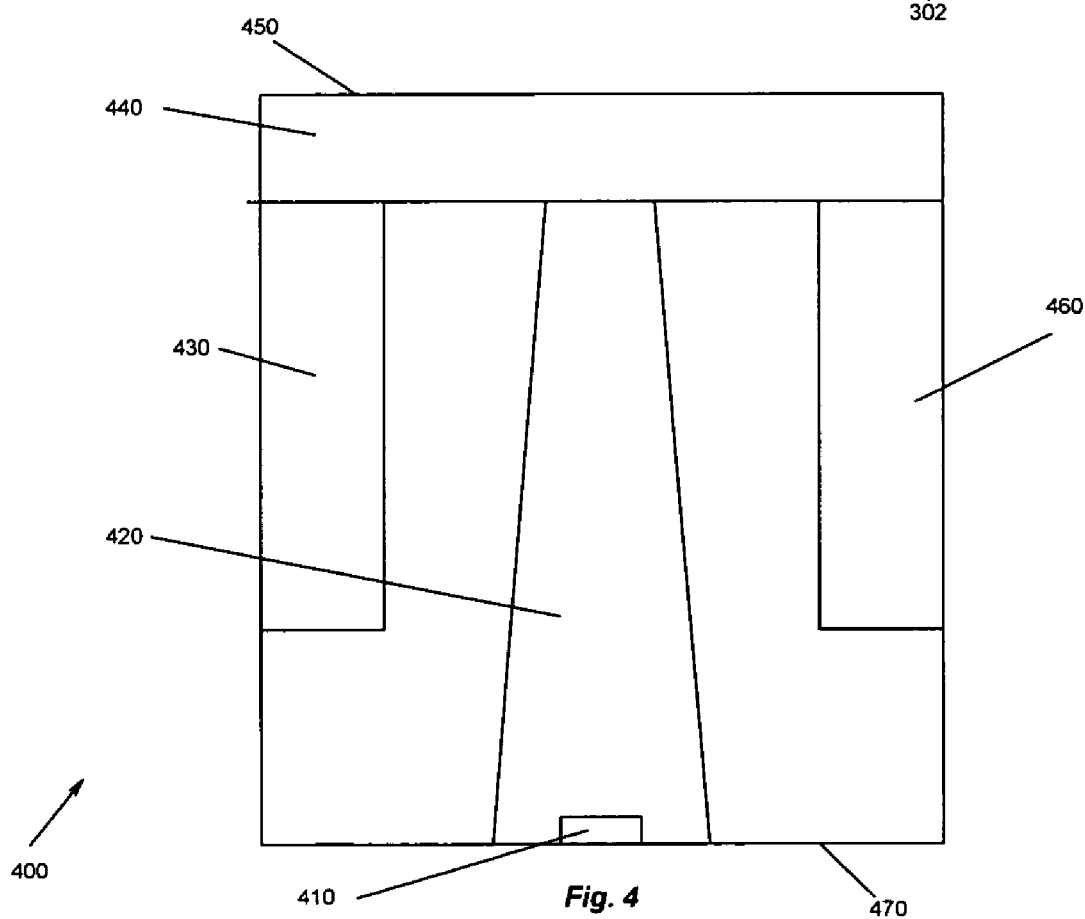

METHOD AND APPARATUS FOR USING A SPECULAR SCATTERING LAYER IN A FREE LAYER OF A MAGNETIC SENSOR WHILE STABILIZING THE FREE LAYER BY DIRECT COUPLING WITH AN ANTIFERROMAGNETIC LAYER

BACKGROUND OF THE INVENTION

1. Field of the Invention

This invention relates in general to magnetic read sensors, and more particularly to a method and apparatus for using a specular scattering layer in a free layer of a magnetic sensor while stabilizing the free layer by direct coupling with an antiferromagnetic layer.

2. Description of Related Art

The heart of a computer is typically a magnetic disk drive which includes a rotating magnetic disk, a slider that has write and read heads, a suspension arm above the rotating disk and an actuator arm. The suspension arm biases the slider into contact with a parking ramp or the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the actuator arm swings the suspension arm to place the write and read heads over selected circular tracks on the rotating disk where field signals are written and read by the write and read heads. The write and read heads are connected to processing circuitry that operates according to a computer program to implement the writing and reading functions.

Conventional magnetoresistive (MR) sensors, such as those used in magnetic recording disk drives, operate on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, called giant magnetoresistance (GMR), has been observed in a variety of magnetic multilayered structures, the essential feature being at least two ferromagnetic metal layers separated by a non-ferromagnetic metal layer. The physical origin of the GMR effect is that the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure, called a spin valve, comprising two uncoupled ferromagnetic layers separated by a nonmagnetic metal layer in which the magnetization of one of the ferromagnetic layers is pinned. The pinning may be achieved by depositing the layer onto an antiferromagnetic layer, which exchange-couples to the pinned layer. The unpinned layer or free ferromagnetic layer is free to rotate in the presence of any small external magnetic field.

Spin valve structures have been identified in which the resistance between two uncoupled ferromagnetic layers is observed to vary as cosine of the angle between the magnetizations of the two layers and is independent of the direction of current flow. The spin valve produces a magnetoresistance that, for selected combinations of materials, is greater in magnitude than AMR. In general, the larger $\Delta R/R$ is the better the spin valve's performance.

The free layer in a magnetic spin valve sensor is usually operated in the presence of a constant weak magnetic field to insure magnetic stability and prevent spurious signals. The application of a weak magnetic field to the sensor is sometimes referred to as magnetically biasing the sensor. An antiferromagnetic layer may be formed beside the free layer to provide biasing to the free layer thereby increasing the stability of the sensor.

Nevertheless, the high resistivity of the antiferromagnetic layer proximate the free layer causes diffusive scattering of the electrons at the interface between the antiferromagnetic layer and the free layer, which in turn results in an increase in resistivity. This spin-independent scattering is detrimental to achieving a high GMR ratio and thus the diffusive scattering must be minimized.

It can be seen then that there is a need for a method and apparatus for using a specular scattering layer in a free layer of a magnetic sensor while stabilizing the free layer by direct coupling with an antiferromagnetic layer.

SUMMARY OF THE INVENTION

To overcome the limitations described above, and to overcome other limitations that will become apparent upon reading and understanding the present specification, the present invention discloses a method and apparatus for using a specular scattering layer in a free layer of a magnetic sensor while stabilizing the free layer by direct coupling with an antiferromagnetic layer.

The present invention solves the above-described problems by forming an antiferromagnetic layer abutting the free layer to provide direct exchange coupling with the free layer. A specular layer is provided in the free layer to remove any $\Delta R$ degradation caused by placement of an antiferromagnetic layer over the free layer.

A read sensor in accordance with the principles of the present invention includes a first antiferromagnetic pinning layer, a pinned layer magnetically coupled to the first antiferromagnetic pinning layer, a free layer disposed over the pinned layer and a second antiferromagnetic pinning layer magnetically coupled to the free layer for stabilizing the free layer, wherein the free layer includes a specular layer for providing specular scattering in the free layer.

In another embodiment of the present invention, a magnetic storage device is provided. The magnetic storage device includes a magnetic medium for storing data thereon, a motor, coupled to the magnetic medium, for moving the magnetic medium by rotating or translating the magnetic medium, a transducer for reading and writing data on the magnetic medium and an actuator, coupled to the transducer, for moving the transducer relative to the magnetic medium, wherein the transducer includes a read sensor including a first antiferromagnetic pinning layer, a pinned layer magnetically coupled to the first antiferromagnetic pinning layer, a free layer disposed over the pinned layer and a second antiferromagnetic pinning layer magnetically coupled to the free layer for stabilizing the free layer, wherein the free layer includes a specular layer for providing specular scattering in the free layer.

In another embodiment of the present invention, a method for forming a read sensor is provided. The method includes forming a first antiferromagnetic pinning layer, forming a pinned layer magnetically coupled to the first antiferromagnetic pinning layer, forming over the pinned layer a free layer having a specular layer for providing specular scattering in the free layer, and forming a second antiferromagnetic pinning layer magnetically coupled to the free layer for stabilizing the free layer.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3 illustrates a slider mounted on a suspension according to an embodiment of the present invention;

FIG. 4 illustrates an ABS view of the slider and the magnetic head according to an embodiment of the present invention;

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method and apparatus for using a specular scattering layer in a free layer of a magnetic sensor while stabilizing the free layer by direct coupling with an antiferromagnetic layer. An antiferromagnetic layer is formed abutting the free layer to provide direct exchange coupling with the free layer. A specular layer is provided in the free layer to remove any ΔR degradation caused by placement of an antiferromagnetic layer over the free layer.

Figure 1:
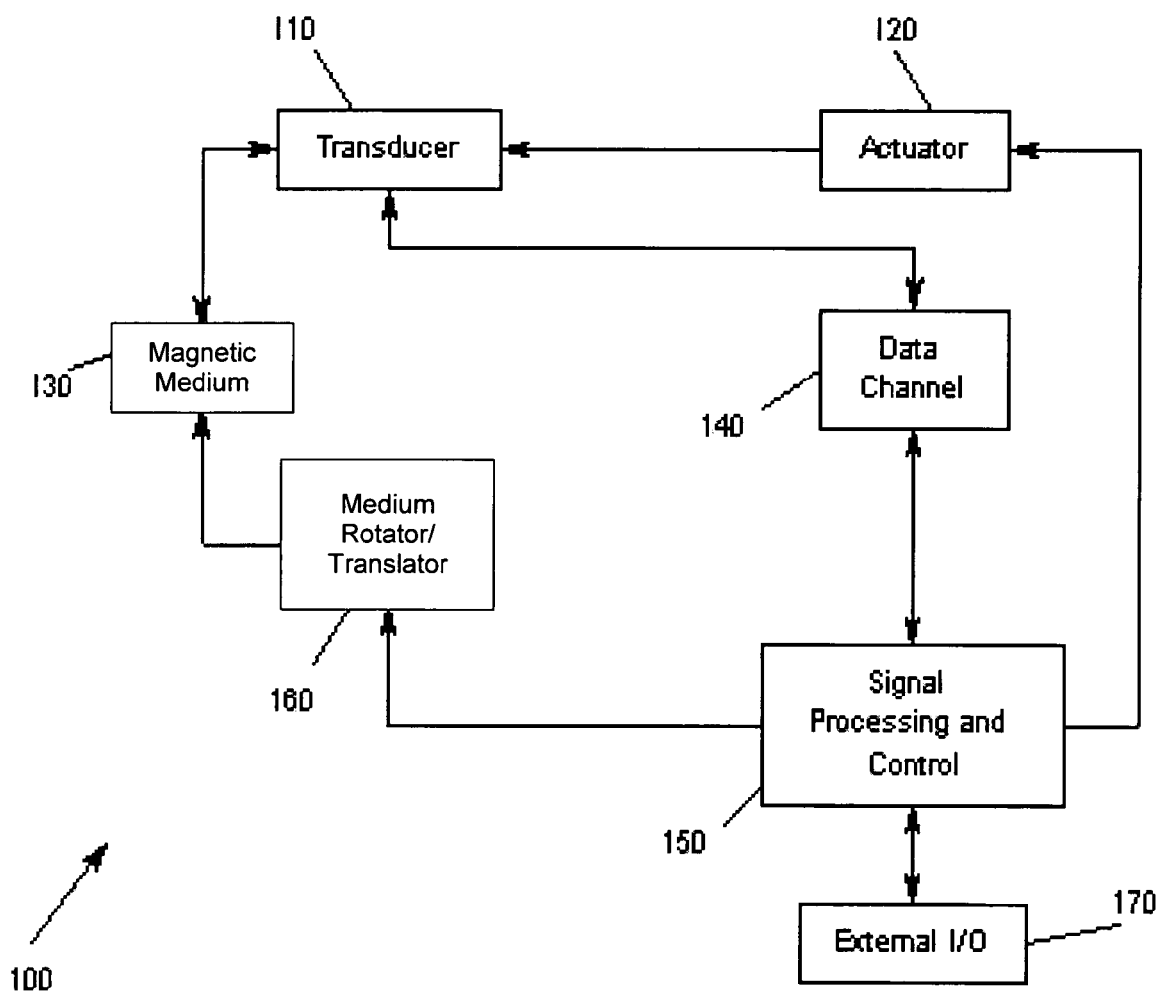
FIG. 1 illustrates a storage system according to an embodiment of the present invention.

FIG. 1 illustrates an exemplary storage system 100 according to the present invention. A transducer 110 is under control of an actuator 120, whereby the actuator 120 controls the position of the transducer 110. The transducer 110 writes and reads data from a magnetic medium 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application, which utilizes storage system 100. In addition, a medium rotator or translator 160 is controlled by the signal processor 150 to cause the magnetic medium 130 to move relative to the transducer 110. The present invention is not meant to be limited to a particular type of storage system 100 or to the type of medium 130 used in the storage system 100.

Figure 2:
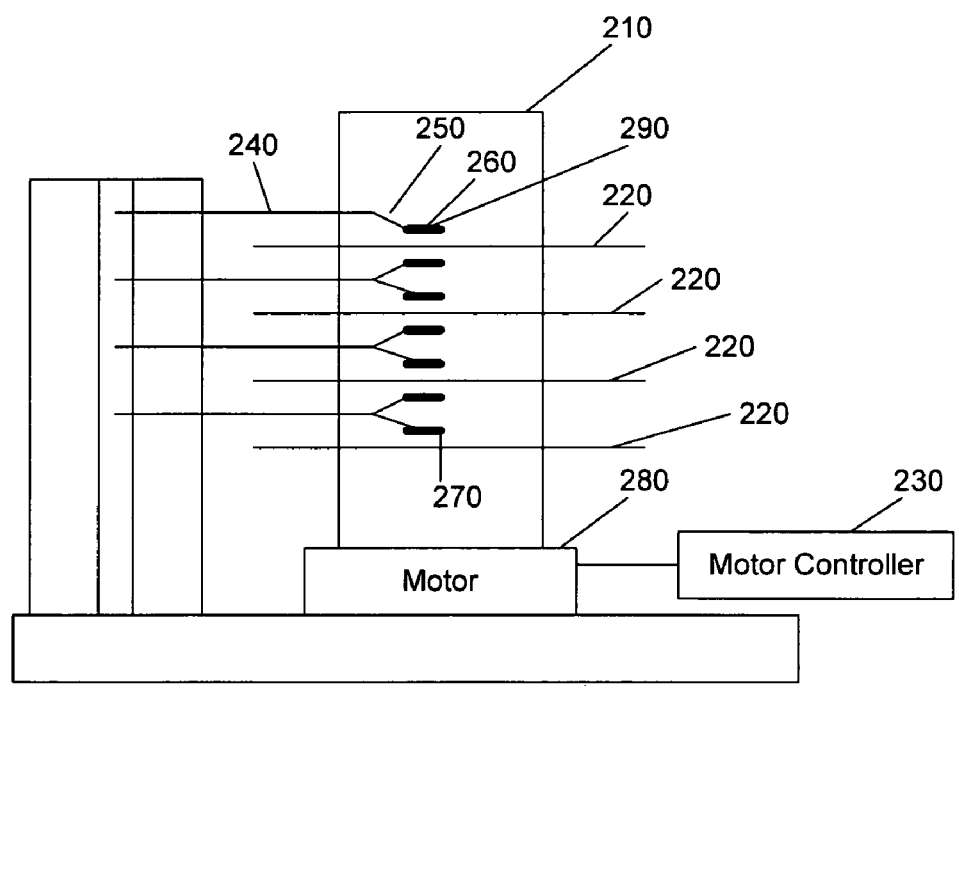
FIG. 2 illustrates one storage system according to an embodiment of the present invention.

FIG. 2 illustrates one particular embodiment of a multiple magnetic disk storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 240 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

FIG. 3 illustrates a sensor assembly 300. In FIG. 3, a slider 320 is mounted on a suspension 322. First and second solder connections 302 and 308 connect leads from the sensor 318 to leads 310 and 314, respectively, on suspension 322 and third and fourth solder connections 304 and 306 connect to the write coil (not shown) to leads 312 and 316, respectively, on suspension 322.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1-4, is for presentation purposes only. Storage systems may contain a large number of recording media and actuators, and each actuator may support a number of sliders. In addition, instead of an air-bearing slider, the head carrier may be one that maintains the head in contact or near contact with the disk, such as in liquid bearing and other contact and near-contact recording disk drives.

Figure 5:
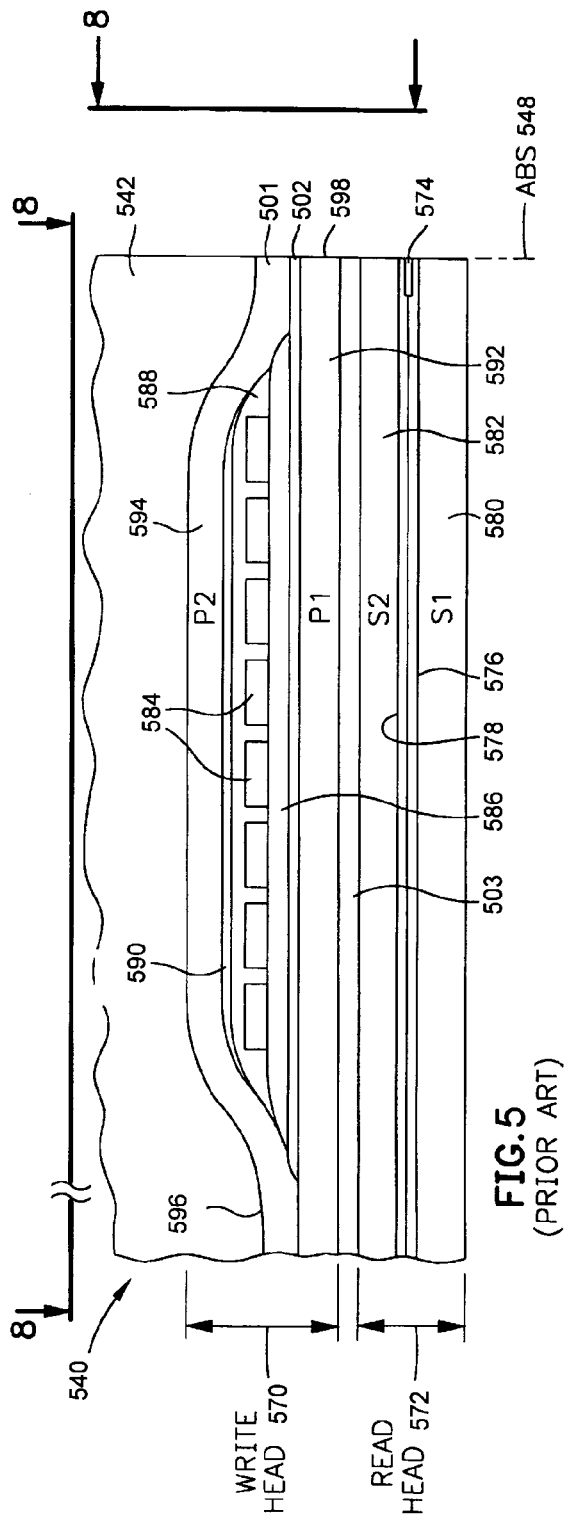
FIG. 5 is a side cross-sectional elevation view of a magnetic head.
Figure 6:
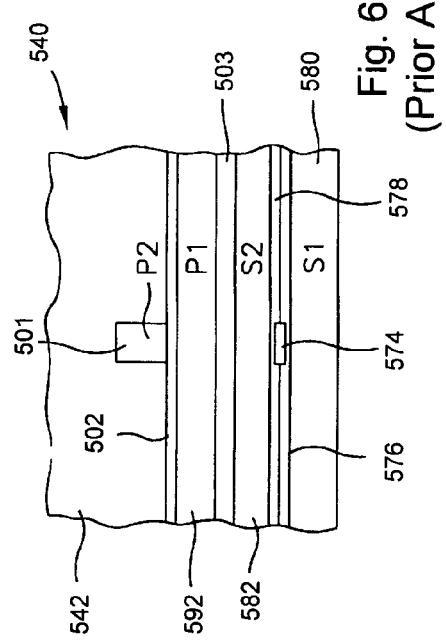
FIG. 6 is an air bearing surface (ABS) view of the magnetic head of FIG. 5.

FIG. 5 is a side cross-sectional elevation view of a magnetic head 540. The magnetic head 540 includes a write head portion 570 and a read head portion 572. The read head portion 572 includes a sensor 574. FIG. 6 is an ABS view of the magnetic head of FIG. 5. The sensor 574 is sandwiched between first and second gap layers 576 and 578, and the gap layers are sandwiched between first and second shield layers 580 and 582. In a piggyback head as shown in FIG. 5, the second shield layer (S2) 582 and the first pole piece (P1) 592 are separate layers. The first and second shield layers 580 and 582 protect the MR sensor element 574 from adjacent magnetic fields. More conventionally, the second shield 582 also functions as the first pole (P1) 592 of the write element, giving rise to the term "merged MR head." However, the present invention is not meant to be limited to a particular type of MR head.

In response to external magnetic fields, the resistance of the sensor 574 changes. A sense current, $I_s$, conducted through the sensor causes these resistance changes to be manifested as voltage changes. These voltage changes are then processed as readback signals by the signal processing system 150 shown in FIG. 1.

The write head portion of the magnetic head includes a coil layer 584 sandwiched between first and second insulation layers 586 and 588. A third insulation layer 590 may be employed for planarizing the head to eliminate ripples in the second insulation layer caused by the coil layer 584. The first, second and third insulation layers are referred to in the art as an "insulation stack." The coil layer 584 and the first, second and third insulation layers 586, 588 and 590 are sandwiched between first and second pole piece layers 592 and 594. The first and second pole piece layers 592 and 594 are magnetically coupled at a back gap 596 and have first and second pole tips 598 and 501 which are separated by a write gap layer 502 at the ABS. The first pole piece layer 592 is separated from the second shield layer 582 by an insulation layer 503.

Figure 7:
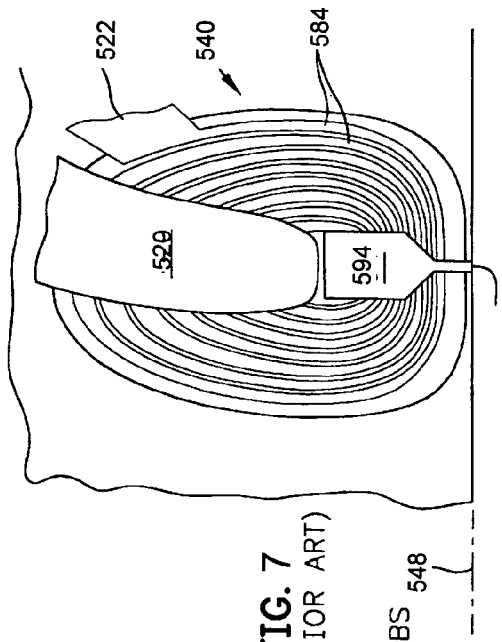
FIG. 7 illustrates the connection leads coupled to the coil for the write pole piece.

FIG. 7 illustrates a view of the connect leads 520, 522 coupled to the coil 584 for the write pole piece 594. As shown in FIGS. 3-7, first and second solder connections 302 and 308 connect leads from the sensor 574 to leads 310 and 314 on the suspension 322, and third and fourth solder connections 304 and 306 connect leads 520 and 522 from the coil 584 (see FIG. 7) to leads 312 and 316 on the suspension (see FIG. 3).

Figure 8:
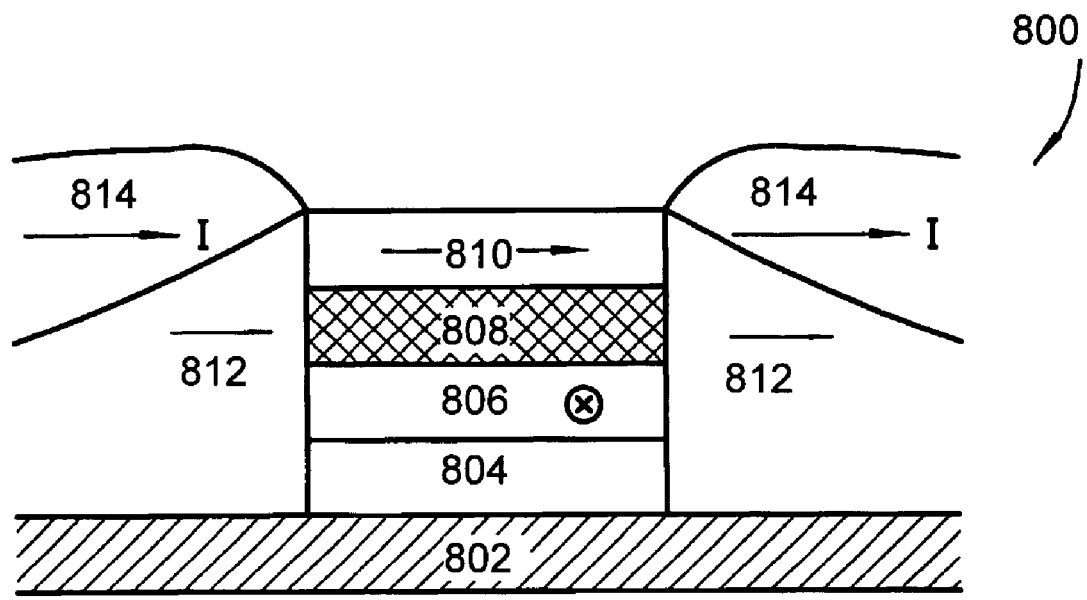
FIG. 8 illustrates the basic components of a typical current-in-plane (CIP) GMR sensor according to one embodiment of the present invention.

FIG. 8 illustrates the basic components of a typical current-in-plane (CIP) GMR sensor 800 according to one embodiment of the present invention. The sensor 800 includes a ferromagnetic reference layer 806 with a fixed transverse magnetic moment (pointing into the page) and a ferromagnetic free layer 810 with a rotatable magnetization vector, which can rotate about the normal to the plane of the free layer film away from the longitudinal direction in response to transverse magnetic signal fields. The direction of the magnetic moment of the reference layer 806 is typically fixed by exchange coupling with an antiferromagnetic layer 804. Exchange-pinned reference layer 806 and free layer 810 are separated by a thin electrically conductive nonmagnetic layer 808. Hard bias layers 812 provide a longitudinal biasing magnetic field to stabilize the magnetization of the free layer 810 approximately in a longitudinal orientation in the absence of other external magnetic fields. Sensor 800 further includes top electrical leads 814 in proximity with hard bias layers 812, and a layer 802 adjacent to the antiferromagnetic layer 804, which represents a combination of the substrate, undercoat, and seed layers. For a shielded sensor, layer 802 may additionally include the bottom shield and insulation layers (for CIP sensors) or electrical contact layers (for CPP sensors).

Figure 9:
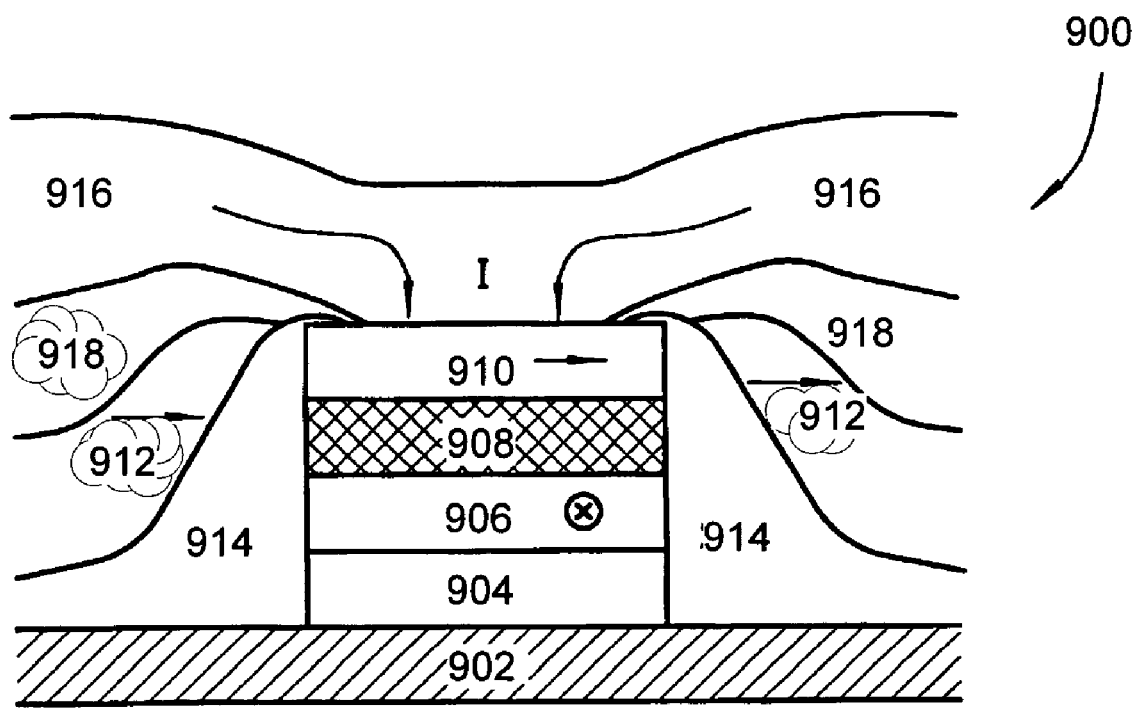
FIG. 9 shows a current-perpendicular-to-plane (CPP) sensor according to one embodiment of the present invention.

FIG. 9 shows a current-perpendicular-to-plane (CPP) sensor 900 according to one embodiment of the present invention. CPP sensor 900 includes a ferromagnetic reference layer 906 with a fixed magnetic moment oriented transversely (into the page) and a ferromagnetic free layer 910 with a rotatable magnetization vector, which can rotate about the normal to the plane of the free layer film away from the longitudinal direction in response to transverse magnetic signal fields. The direction of the magnetic moment of the reference layer 906 is typically fixed by exchange coupling with an antiferromagnetic layer 904. The exchange-pinned reference layer 906 and free layer 910 are spaced apart by a non-magnetic layer 908. For magnetic tunnel junction (MTJ) devices, layer 908 includes an electrically insulating tunnel barrier layer. For CPP-GMR devices, layer 908 is electrically conductive, and is analogous to layer 808 of the CIP-GMR sensor of FIG. 8. Hard bias layers 912 are electrically insulated from the sensor stack and the top electrical lead 916 by insulating layers 914 and 918 respectively. Hard bias layers 912 provide a longitudinal biasing magnetic field to stabilize the magnetization of the free layer 910. Sensor 900 further includes a layer 902, which is similar to layer 802 of sensor 800, in proximity with the antiferromagnetic layer 904.

The above description of a CPP and CIP magnetic sensor, shown in the accompanying FIGS. 8-9, is for presentation purposes only. Those skilled in the art will recognize that other embodiments that provide CPP and CIP sensors are possible, including dual sensor structures, etc.

Figure 10:
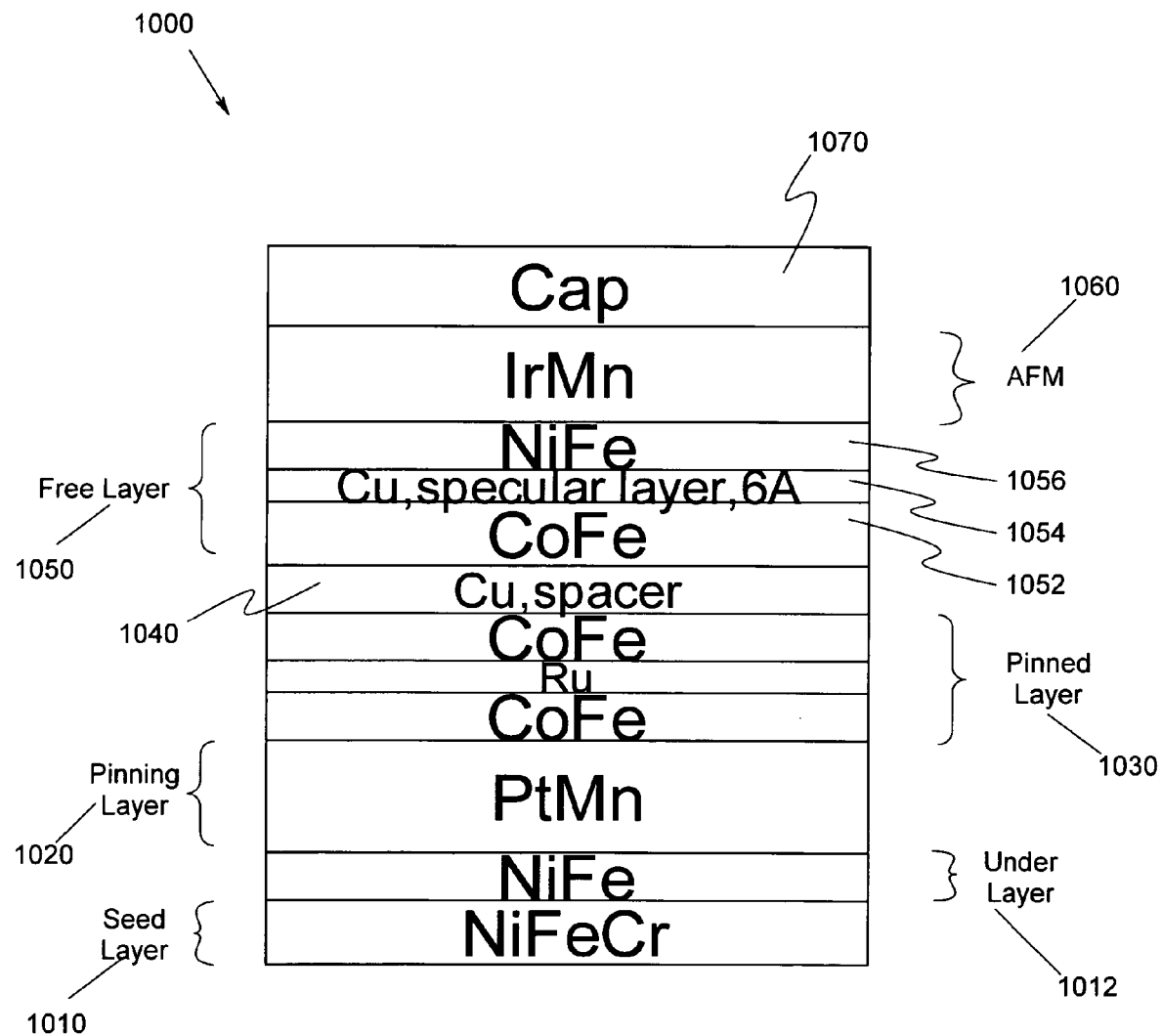
FIG. 10 illustrates a stack layer structure for a read sensor according to an embodiment of the present invention.

FIG. 10 illustrates a stack 1000 for a read sensor according to an embodiment of the present invention. In FIG. 10, the stack 1000 includes a seed layer 1010, e.g., a layer of nickel-iron-chromium (NiFeCr), and an under layer 1012, e.g., a nickel-iron (NiFe) layer. A pinning layer 1020 is formed over the under layer 1012. The pinning layer 1020 may be a layer of platinum-manganese (PtMn). The pinning layer 1020 provides a field to pin the pinned layer 1030 formed thereon. The pinned layer 1030 may comprise a first cobalt-iron (CoFe) layer, a ruthenium (Ru) interlayer, and a second cobalt-iron (CoFe) layer. A spacer 1040, e.g., copper, is formed over the pinned layer 1030. A free layer 1050 is formed over the spacer 1040. The free layer 1050 is further stabilized using an antiferromagnetic layer 1060. The antiferromagnetic layer 1060 may be an iridium-manganese (IrMn) layer. A cap 1070 is formed over the antiferromagnetic layer 1060.

The free layer 1050 includes a cobalt-iron (CoFe) layer 1052, a specular layer 1054 and a nickel-iron (NiFe) layer 1056. The specular layer 1054 is provided in the free layer 1050 to remove any ΔR degradation caused by placement of AFM layer 1060 over the free layer 1050. The specular layer 1054 is thin, e.g., only 6 to 8 Å thick, to allow exchange pinning between the layers of the free layer, e.g., NiFe 1056 and the CoFe 1052 layers. The specular layer 1054 may be a copper layer and is provided in the free layer to avoid diffusive scattering from the high resistivity interface with the antiferromagnetic layer 1060. Thus, the specular layer 1054 provides specular scattering in a free layer 1050 of a magnetic sensor while the free layer 1050 is stabilized by direct exchange coupling with the antiferromagnetic layer 1060. Those skilled in the art will recognize that the layers may comprise compositions other than those shown in FIG. 10.

Figure 11:
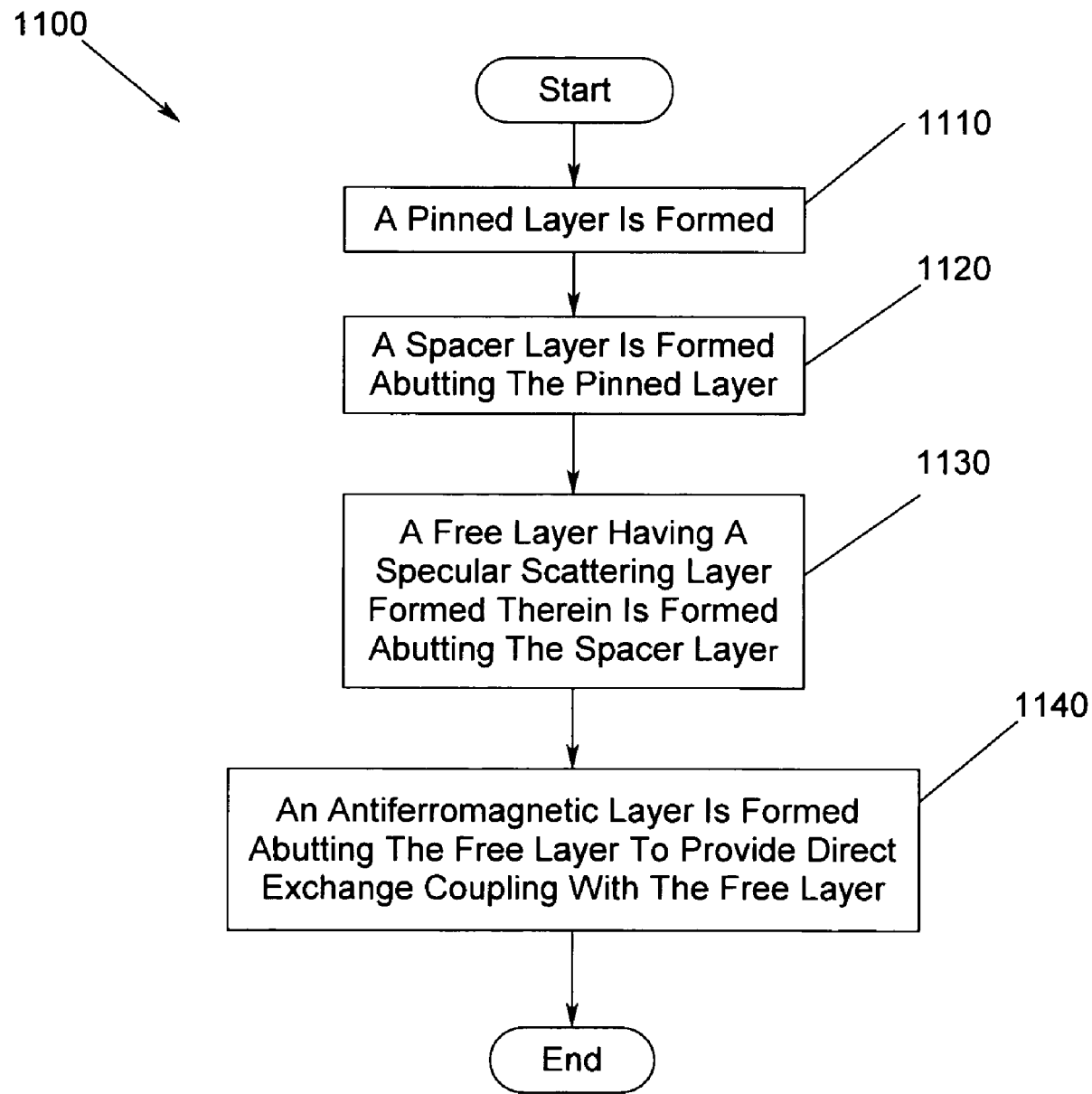
FIG. 11 is a flow chart of the method for forming a sensor according to an embodiment of the present invention.

FIG. 11 is a flow chart 1100 of the method for forming a sensor according to an embodiment of the present invention. A pinned layer is formed 1110. A spacer layer is formed abutting the pinned layer 1120. A free layer having a specular scattering layer formed therein is formed abutting the spacer layer 1130. An antiferromagnetic layer is formed abutting the free layer to provide direct exchange coupling with the free layer 1140.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A read sensor, comprising:
   a first antiferromagnetic pinning layer;
   a pinned layer magnetically coupled to the first antiferromagnetic pinning layer;
   a free layer disposed over the pinned layer; and
   a second antiferromagnetic pinning layer abutting the free layer and magnetically coupled to the free layer for stabilizing the free layer, the free layer including a first and second free sublayer with a specular layer for providing specular scattering in the free layer, the specular layer disposed between and abutting the first and second free sublayer;
   wherein the specular layer comprises a copper layer.

2. The read sensor of claim 1 further comprising a seed layer and an underlayer disposed abutting the seed layer.

3. The read sensor of claim 2, wherein the seed layer comprises a nickel-iron-chromium layer and the underlayer comprises a nickel-iron layer.

4. The read sensor of claim 1, wherein the first antiferromagnetic pinning layer comprises a platinum-manganese layer and wherein the pinned layer comprises a first cobalt-iron layer, a ruthenium interlayer and a second cobalt-iron layer.

5. The read sensor of claim 1, wherein the second antiferromagnetic layer abutting the free layer comprises an iridium-manganese layer.

6. The read sensor of claim 1, wherein the free layer further includes a cobalt-iron layer and a nickel-iron layer sandwiching the specular layer.

7. The read sensor of claim 6, wherein the specular layer is 6 to 8 Å thick to allow exchange pinning between the cobalt-iron layer and the nickel-iron layer.

8. The read sensor of claim 1, wherein the specular layer removes any ΔR degradation caused by placement of the second antiferromagnetic layer abutting the free layer.

9. The read sensor of claim 1, wherein the specular layer prevents diffusive scattering from a high resistivity interface provided by the second antiferromagnetic layer abutting the free layer.

10. The read sensor of claim 1, wherein the specular layer prevents diffusive scattering at an interface between the free layer and the second antiferromagnetic layer abutting the free layer to decrease resistivity and to increase a GMR ratio of the sensor.

11. magnetic storage device, comprising:
    a magnetic medium for storing data thereon;
    a motor, coupled to the magnetic medium, for moving the magnetic medium;
    a transducer for reading and writing data on the magnetic medium; and
    an actuator, coupled to the transducer, for moving the transducer relative to the magnetic medium;
    wherein the transducer includes a read sensor comprising:
      a first antiferromagnetic pinning layer;
      a pinned layer magnetically coupled to the first antiferromagnetic pinning layer;
      a free layer disposed over the pinned layer; and
      a second antiferromagnetic pinning layer abutting the free layer and magnetically coupled to the free layer for stabilizing the free layer, the free layer including a first and second free sublayer with a specular layer for providing specular scattering in the free layer, the specular layer disposed between and abutting the first and second free sublayer;
    wherein the specular layer comprises a copper layer.

12. The magnetic storage device of claim 11 further comprising a seed layer and an underlayer disposed abutting the seed layer.

13. The magnetic storage device of claim 12, wherein the seed layer comprises a nickel-iron-chromium layer and the underlayer comprises a nickel-iron layer.

14. The magnetic storage device of claim 11, wherein the first antiferromagnetic pinning layer comprises a platinum-manganese layer and wherein the pinned layer comprises a first cobalt-iron layer, a ruthenium interlayer and a second cobalt-iron layer.

15. The magnetic storage device of claim 11, wherein the second antiferromagnetic layer abutting the free layer comprises an iridium-manganese layer.

16. The magnetic storage device of claim 11, wherein the free layer further includes a cobalt-iron layer and a nickel-iron layer sandwiching the specular layer.

17. The magnetic storage device of claim 16, wherein the specular layer is 6 to 8 Å thick to allow exchange pinning between the cobalt-iron layer and the nickel-iron layer.

18. The magnetic storage device of claim 11, wherein the specular layer removes any ΔR degradation caused by placement of the second antiferromagnetic layer abutting the free layer resulting from diffusive scattering from a high resistivity interface provided by the second antiferromagnetic layer abutting the free layer.

19. The magnetic storage device of claim 11, wherein the specular layer prevents diffusive scattering at an interface between the free layer and the second antiferromagnetic layer abutting the free layer.

20. A method for forming a read sensor, comprising:
    forming a first antiferromagnetic pinning layer;
    forming a pinned layer magnetically coupled to the first antiferromagnetic pinning layer;
    forming, over the pinned layer, a free layer, the free layer including a first and second free sublayer with a specular layer for providing specular scattering in the free layer, the specular layer disposed between and abutting the first and second free sublayer; and
    forming a second antiferromagnetic pinning layer abutting the free layer and magnetically coupled to the free layer for stabilizing the free layer;
    wherein the forming the specular layer further comprises forming a copper layer.

21. The method of claim 20 further comprising forming a seed layer and forming an underlayer abutting the seed layer, wherein the forming the seed layer further comprises forming a nickel-iron-chromium layer and forming the underlayer further comprises forming a nickel-iron layer.

22. The method of claim 20, wherein the forming the first antiferromagnetic pinning layer further comprises forming a platinum-manganese layer, the forming the pinned layer further comprises forming a first cobalt-iron layer, a ruthenium interlayer and a second cobalt-iron layer and the forming the second antiferromagnetic layer further comprises forming an iridium-manganese layer abutting the free layer.

23. The method of claim 20, wherein the forming the free layer further includes forming a cobalt-iron layer and a nickel-iron layer sandwiching the specular layer.

24. The method of claim 20, wherein the forming the specular layer further comprises forming a specular layer that prevents diffusive scattering at an interface between the free layer and the second antiferromagnetic layer abutting the free layer.

* * * * *